United States Patent
Tsuduki et al.

(10) Patent No.: US 8,279,336 B2
(45) Date of Patent: Oct. 2, 2012

(54) SOLID-STATE IMAGE PICKUP DEVICE (75) Inventors: Koji Tsuduki, Kawasaki (JP); Hisatane Komori, Ayase (JP); Yasuhiro Matsuki, Atsugi (JP); Satoru Hamasaki, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 318 days.

(21) Appl. No.: 12/795,458

(22) Filed: Jun. 7, 2010

(65) Prior Publication Data

US 2010/0309354 A1 Dec. 9, 2010

(30) Foreign Application Priority Data

Jun. 9, 2009 (JP) ................. 2009-138402

(51) Int. Cl.
*H04N 5/225* (2006.01)
(52) U.S. Cl. ....................................................... 348/374
(58) Field of Classification Search .................... 348/374
See application file for complete search history.

(56) References Cited

U.S. PATENT DOCUMENTS 6,864,117 B2 * 3/2005 Minamio et al. ............... 438/66
7,616,250 B2 * 11/2009 Watanabe et al. ............. 348/340
2004/0214369 A1 * 10/2004 Minamio et al. ............. 438/106
2006/0023108 A1 * 2/2006 Watanabe et al. ............. 348/335
2008/0042227 A1 2/2008 Asano
2009/0121304 A1 * 5/2009 Terada ............................ 257/434

FOREIGN PATENT DOCUMENTS

JP 7-202152 A 8/1995
JP 2006-295481 A 10/2006

* cited by examiner

*Primary Examiner* — Jason Chan
*Assistant Examiner* — Gary C Vieaux
(74) *Attorney, Agent, or Firm* — Canon U.S.A., Inc. IP Division (57) ABSTRACT A cover member fixed to a pickup element has a non-vertical surface and an upright surface and satisfies $H2 \tan(\theta A - 2\theta C) \leq L1 + L1'$ at any point on the upright surface, and $H \tan(\theta A - 2\theta B) + (H1)\tan \theta B \leq L1$ and $\theta B > \theta C$ at any point on the non-vertical surface, where $\theta A$ is the inclination of incident light, $\theta B$ is the inclination at a point on the non-vertical surface, $\theta C$ is the inclination at a point on the upright surface, $H1$ is the height of the non-vertical surface, $H2$ is the height of the upright surface, $H$ is the height of the frame portion, $L1$ is the distance from the edge of a pixel region to the upper edge of the upright surface, and $L1'$ is the distance from the upper edge to the lower edge of the upright surface in the planar direction.

20 Claims, 8 Drawing Sheets

SOLID-STATE IMAGE PICKUP DEVICE

BACKGROUND OF THE INVENTION

1. Field of the Invention

The present invention relates to a solid-state image pickup device, and more specifically, it relates to a solid-state image pickup device including a solid-state image pickup element and a cover member fixed thereto and having a transparent flat plate portion.

2. Description of the Related Art

In recent years, with the reduction in size and thickness of digital cameras and cellular phones, a further reduction in size and thickness of solid-state image pickup elements has been applied.

So, a solid-state image pickup device is proposed that includes a solid-state image pickup element chip, and a cover member formed of a transparent material and having a flat plate portion and a frame portion integrally formed on the edge of the underside of the flat plate portion, the cover member being hermetically attached to the solid-state image pickup element chip.

In the case of a solid-state image pickup device disclosed in Japanese Patent Laid-Open No. 7-202152, the inner wall of the frame portion is perpendicular to the surface of the solid-state image pickup element. Therefore, in order to prevent unwanted light reflected by the inner wall of the frame portion from being incident on the light detecting elements, the frame portion is to be located away from the light detecting elements. For this reason, the solid-state image pickup device cannot be sufficiently reduced in size.

In the case of a solid-state image pickup device disclosed in Japanese Patent Laid-Open No. 2006-295481, the inner wall of the frame portion has an inclined surface that is inclined toward the light detecting elements with respect to the surface of the solid-state image pickup element. However, in order to sufficiently prevent moisture from entering from the outside, a relatively large bonding region is used between the frame portion and the solid-state image pickup element. Therefore, the solid-state image pickup device cannot be sufficiently reduced in size.

U.S. Patent Application Publication No. US 2008/0042227 describes forming a recess in a transparent plate by chemical etching or thermoforming processing. However, in order to prevent unwanted light reflected by the inner wall of a rib from being incident on the light detecting portion, the frame portion is to be located away from the light detecting portion. For this reason, the solid-state image pickup device cannot be sufficiently reduced in size.

In each example, achieving both the reduction of the solid-state image pickup device in size and the prevention of unwanted light from being incident on the light detecting elements is not considered.

SUMMARY OF THE INVENTION

In a first aspect of the present invention, a device includes a pickup element having a pixel region having a plurality of light detecting elements, and a cover member that covers the pixel region and is fixed to the pickup element. The cover member has a frame portion fixed to a region surrounding the pixel region, and a flat plate portion disposed over the pixel region with the frame portion and a space therebetween. An inner wall of the frame portion has a non-vertical surface and an upright surface with respect to a light detecting surface of the pickup element in an order from the flat plate portion, and satisfies the following expressions:

$$H2 \tan(\theta A - 2\theta C) \leq L1 + L1' \quad (1)$$

at any point on the upright surface of the inner wall, and $$H \tan(\theta A - 2\theta B) + (H1)\tan \theta B \leq L1 \quad (2) \text{ and}$$

$$\theta B > \theta C \quad (3)$$

at any point on the non-vertical surface, where $\theta A$ is an inclination angle of incident light with respect to a normal to the light detecting surface, $\theta B$ is an inclination angle of the non-vertical surface at a point on the non-vertical surface on which the incident light is incident, $\theta C$ is an inclination angle of the upright surface at a point on the upright surface on which the incident light is incident, $H$ is a height of the frame portion from the light detecting surface, $H1$ is a height of the non-vertical surface, $H2$ is a height of the upright surface from the light detecting surface, $L1$ is a distance from an edge of the pixel region to an upper edge of the upright surface of the inner wall of the frame portion in a direction parallel to the light detecting surface, and $L1'$ is a distance from the upper edge to a lower edge of the upright surface in the direction parallel to the light detecting surface.

Further features of the present invention will become apparent from the following description of exemplary embodiments with reference to the attached drawings.

DESCRIPTION OF THE EMBODIMENTS

The embodiments of the present invention will now be described with reference to FIGS. 1A to 8B.

First Embodiment

A solid-state image pickup device according to a first embodiment of the present invention will be described with reference to FIGS. 1A to 1C.

Figure 1A:
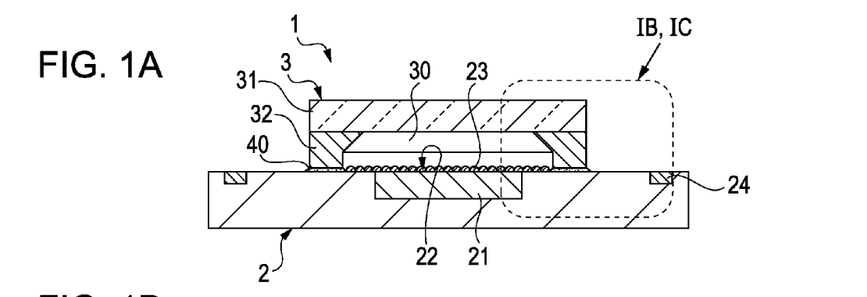
FIGS. 1A, 1B, and 1C are a sectional view and enlarged sectional views showing an embodiment of a solid-state image pickup device according to the present invention.

FIG. 1A is a sectional view of a solid-state image pickup device according to a first embodiment. FIGS. 1B and 1C are enlarged sectional views of the part enclosed by a dashed line IB, IC of FIG. 1A.

A solid-state image pickup element 2 of FIG. 1A has an effective pixel region 21 that has a plurality of light detecting elements. The surface of the effective pixel region serves as a light detecting surface 22. The effective pixel region further has a color filter (not shown) disposed on the light incident side of the light detecting elements and a planarizing film (not shown) disposed on the color filter. When the effective pixel region has a planarizing film, the surface of the planarizing film serves as a light detecting surface. When the effective pixel region does not have a planarizing film, the surface of the color filter serves as a light detecting surface. The solid-state image pickup element 2 has convexities that serve as microlenses 23 disposed on the effective pixel region. The solid-state image pickup element 2 is a CCD image sensor or a CMOS image sensor.

To a region surrounding the effective pixel region 21 of the solid-state image pickup element 2, a cover member 3 is fixed with a fixing member 40. The cover member 3 has a structure in which a flat plate portion 31 and a frame portion 32 are integrated so as to form a recess. The cover member 3 is formed of a light transmissive material, such as glass, resin, or crystal. The cover member 3 may have an integral structure in which a recess is formed in a glass or resin plate by abrasion, etching, or using a die, or an assembled structure in which a frame is fixed to a transparent flat plate of glass or resin. In the case of the assembled structure, the frame portion may be formed of metal. If the flat plate portion 31 has an antireflection coat or IR coat on the top or underside thereof, the optical characteristics are improved. In order to obtain excellent images, reflected light from the frame portion 32 is to be prevented from being incident on the effective pixel region 21. For this purpose, the frame portion 32 is formed of a material having a refractive index close to the refractive index of air (1) or a material having a high light absorptance. It is also to provide the same antireflection coat or IR coat as that on the flat plate portion 31, on the inner wall or outer wall of the frame portion 32. The fixing member 40 is formed by applying unhardened adhesive to the solid-state image pickup element 2 or the cover member 3 and hardening the adhesive after bonding the solid-state image pickup element 2 and the cover member 3. Between the solid-state image pickup element 2 and the cover member 3 is defined a space 30. The space 30 is under an air atmosphere or nitrogen atmosphere.

Figure 1B:
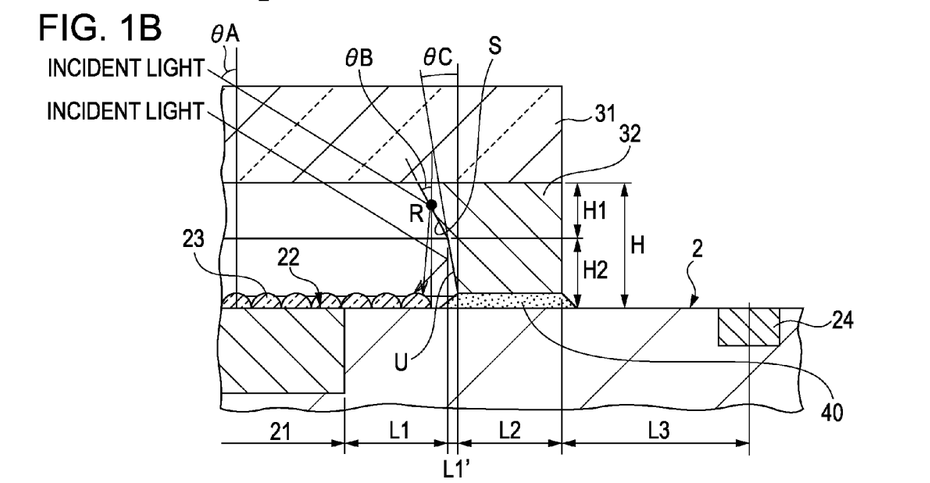

FIG. 1B is an enlarged sectional view of the part enclosed by a dashed line IB, IC of the solid-state image pickup device 1 shown in FIG. 1A.

In FIG. 1B, the effective pixel region 21 is a range corresponding to the region where the light detecting elements are disposed, and the surface of the effective pixel region 21 serves as the light detecting surface 22 of the solid-state image pickup element 2.

The inner wall surface of the frame portion 32 includes a non-vertical surface S having a height of H1 such that the space 30 becomes gradually wider from the flat plate portion side toward the solid-state image pickup element side, and an upright surface U having a height of H2, and has a total height of H. In other words, the inner wall surface of the frame portion 32 has, in order, an upright surface U having a height of H2 from a position laterally away from the effective pixel region 21 of the solid-state image pickup element 2, and a non-vertical surface S having a height of H1 that is inclined inward, toward the effective pixel region.

The non-vertical surface S is disposed closer to the flat plate portion than the upright surface U. The non-vertical surface S is a surface formed in such a manner that the space 30 becomes narrower toward the transparent flat plate portion. In this embodiment, the non-vertical surface S is a plane surface. The non-vertical surface S is capable of preventing light reflected by the upper part of the inner wall of the frame portion 32 from being incident on the effective pixel region 21. The position at which the non-vertical surface S meets the flat plate portion 31 may be disposed in a region other than the region just above the effective pixel region 21. This is to prevent image degradation caused by incident light that passes through the cover member 3 just above a region surrounding the effective pixel region 21 and is incident on the effective pixel region 21 owing to refraction.

The angle of the upright surface U is smaller than the angle of the non-vertical surface S. Therefore, the solid-state image pickup element can be reduced in size.

Figure 1C:
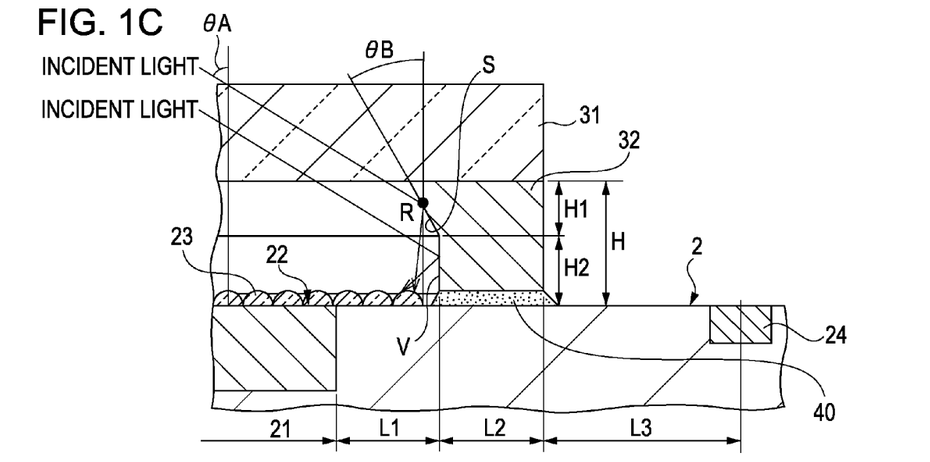

FIG. 1C is an enlarged sectional view of the part enclosed by a dashed line IB, IC of FIG. 1A, and it shows a configuration different from that of FIG. 1B.

FIG. 1C differs from FIG. 1B in that the upright surface U is a vertical surface V substantially perpendicular to the light detecting surface 22 of the solid-state image pickup element 2. Therefore, the solid-state image pickup element can be further reduced in size.

The above vertical surface V includes a surface at an angle of 90° with respect to the light detecting surface 22 of the solid-state image pickup element 2 and a surface at an angle of 90°±3° in consideration of the processing accuracy of the cover member 3 and the assembly accuracy. The vertical surface V is disposed laterally at a distance L1 from the effective pixel region 21. The distance L1 is determined by considering, for example, the prevention of entrance of adhesive into the effective pixel region at the time of bonding of the solid-state image pickup element and the cover member, and the fixing position accuracy of the frame portion. By providing the vertical surface V of the frame portion 32 having an appropriate height H2 at a position a distance L1 laterally away from the effective pixel region 21, incident light can be prevented from being incident on the effective pixel region 21. Although incident light actually changes its traveling direction when passing through the interfaces between air, the cover member 3, and air, it is expressed in a straight line because the angle of incidence is substantially equal to the angle of refraction.

L2 denotes the width of the frame portion 32. The value of this width roughly determines the fixing width between the frame portion 32 and the solid-state image pickup element 2. The width L2 determines the extent to which moisture is prevented from entering the space 30 from the outside of the solid-state image pickup device 1. Therefore, the width L2 is an important factor. L3 denotes the distance from the outer wall of the frame portion 32 to the center of the terminal 24. The distance L3 is a width for avoiding contact between a bonding capillary and the cover member 3 at the time of wire bonding. Therefore, in any of L1 to L3, a certain distance is needed. For L3 to be shortened, terminals on the opposite side of the solid-state image pickup element 2 from the light incident side are to be provided.

Figure 8A:
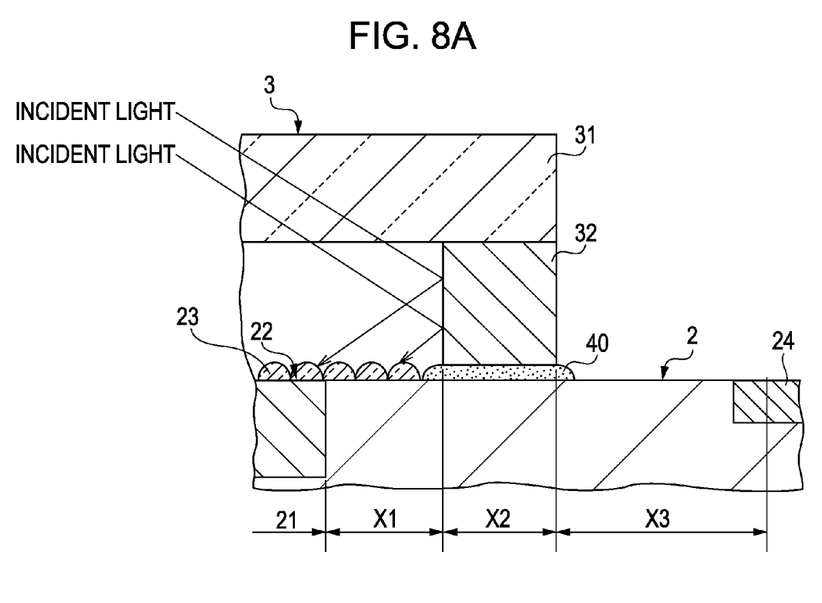
FIGS. 8A and 8B are enlarged sectional views showing a conventional solid-state image pickup device.
Figure 8B:
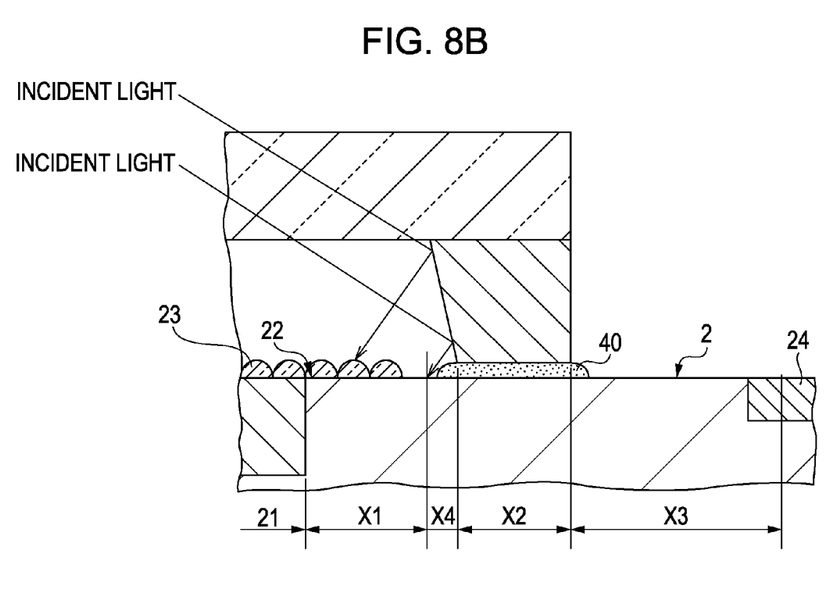

The benefits of the present invention will be described by describing the difference from each of the solid-state image pickup devices of FIGS. 8A and 8B. FIGS. 8A and 8B are enlarged views of a conventional solid-state image pickup device.

In the cover member 3 of FIG. 8A, the inner wall of the frame portion 32 is a vertical surface. In the case of such a frame portion 32, light reflected by the lower part of the inner wall is not incident on the effective pixel region 21 owing to the distance X1, whereas light reflected by the upper part of the inner wall is incident on the effective pixel region 21. Therefore, the image quality is lowered. In order to prevent light from the inner wall of the frame portion from being incident on the effective pixel region in order to prevent image degradation, the inner wall can be located away from the pixel region, that is to say, the length of X1 can be increased. However, this increases the solid-state image pickup element 2 in size. Alternatively, if X1 is increased and the width X2 of the inner wall is reduced, the size of the solid-state image pickup element 2 can be maintained. However, in this case, the moisture-proof property is lowered.

When the entire inner wall is an inclined surface as shown in FIG. 8B so that light from the inner wall is not incident on the effective pixel region 21, a length of X4 is used and the solid-state image pickup element 2 is increased in size. Therefore, the configuration of FIG. 8 may be undesirable.

By inclining only the upper part of the inner wall of the frame portion as in the solid-state image pickup device shown in FIG. 1 so that light reflected by the inner wall of the frame portion that is particularly prone to be incident on the effective pixel region is incident on the outside of the pixel region, the reduction in size of the solid-state image pickup device and the improvement of image quality can be achieved. The reduction in size of the solid-state image pickup device is, for example, to reduce the region denoted by X4 in FIG. 8B.

The inner wall structure of the cover member of FIGS. 1A to 1C satisfies the following relational expressions.

First, the case of the configuration of FIG. 1B will be described. The inner wall satisfies the following relational expression:

$$H2 \tan(\theta A - 2\theta C) \leq L1 + L1' \quad (1)$$

at any point on the upright surface of the inner wall, and satisfies the following relational expressions:

$$H \tan(\theta A - 2\theta B) + (H1) \tan \theta B \leq L1 \quad (2) \text{ and}$$

$$\theta B > \theta C \quad (3)$$

at any point on the non-vertical surface of the inner wall, where θA is the inclination angle of incident light with respect to a normal to the light detecting surface, θB is the inclination angle of the non-vertical surface S with respect to a normal to the light detecting surface at a point (R) on the non-vertical surface S on which the incident light is incident, θC is the inclination angle of the upright surface U with respect to a normal to the light detecting surface at a point on the upright surface U on which the incident light is incident, H is the height of the frame portion 32, H1 is the height of the non-vertical surface, H2 is the height of the upright surface, L1 is the distance from the edge of the pixel region to the upper edge of the upright surface of the inner wall of the frame portion in the direction parallel to the light detecting surface, and L1' is the distance from the upper edge to the lower edge of the upright surface in the direction parallel to the light detecting surface.

By forming the inner wall within the ranges of the above relational expressions, both the reduction of image degradation (generation of so-called ghost images) caused by light reflected by the inner wall and incident on the pixel region, and the reduction in size of the solid-state image pickup element can be achieved.

Next, the case of the configuration of FIG. 1C will be described. The inner wall satisfies the following relational expression:

$$H2 \tan \theta A \leq L1 \quad (1)'$$

at any point on the vertical surface of the inner wall, and satisfies the following relational expression:

$$H \tan(\theta A - 2\theta B) + (H1) \tan \theta B \leq L1 \quad (2)$$

at any point on the non-vertical surface of the inner wall. The elements of the expressions are the same as those defined above except that "upright surface" is replaced with "vertical surface."

FIGS. 2A to 2F show the cover member 3 of FIGS. 1A to 1C and other cover members.

Figure 2A:
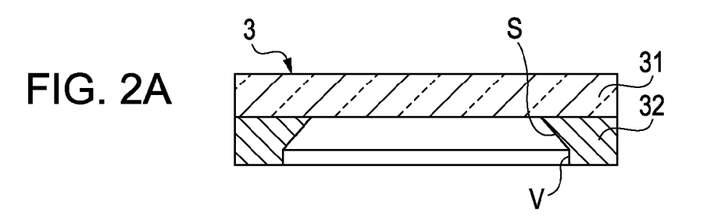
FIGS. 2A, 2B, 2C, 2D, 2E, and 2F are sectional views showing an embodiment of a solid-state image pickup device according to the present invention.

FIG. 2A shows the cover member 3 described in FIG. 1. The non-vertical surface S of the inner wall of the frame portion 32 has an inclined surface that is a plane surface. In the case of the cover member 3 of FIG. 2B, the non-vertical surface S has two inclined surfaces that are two plane surfaces. The non-vertical surface S is not limited to these, and may have three or more inclined surfaces. However, for ease of processing, the non-vertical surface S is a plane surface. The surface on the opposite side of the non-vertical surface S of the inner wall of the frame portion 32 from the flat plate portion is a vertical surface V. The vertical surface V may be an upright surface U as described above. In the case of the cover member 3 of FIG. 2C, the non-vertical surface S of the inner wall of the frame portion 32 has an inclined surface that is a curved surface. FIGS. 2D, 2E, and 2F show cover members 3 that correspond to the cover members 3 of FIGS. 2A, 2B, and 2C, respectively, and that have a flat plate portion 31 and a frame portion 32 integrally formed into a one-piece member. The non-vertical surface that is a curved surface may have a textured structure that does not affect the traveling direction of light (a textured structure having a pitch of several nm to 300 nm).

Figure 2B:
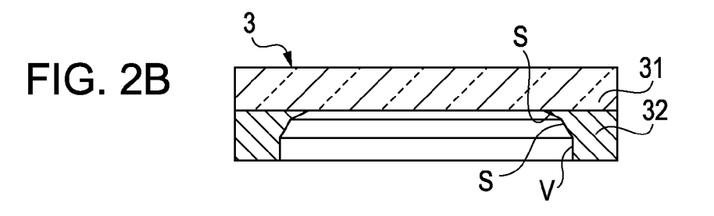
Figure 2C:
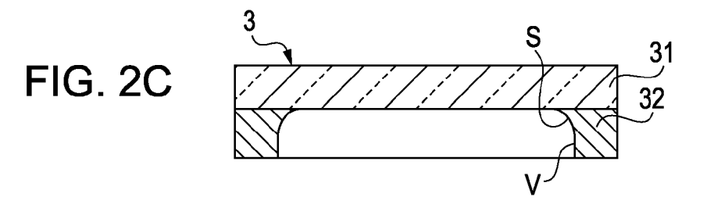
Figure 2D:
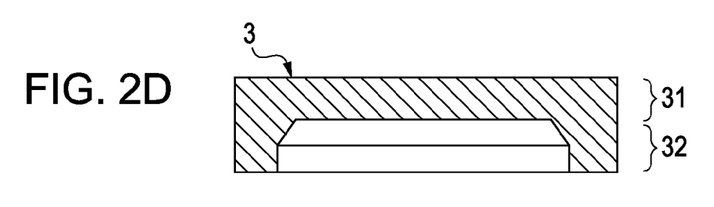
Figure 2E:
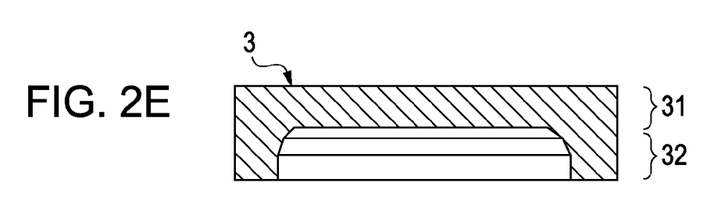
Figure 2F:
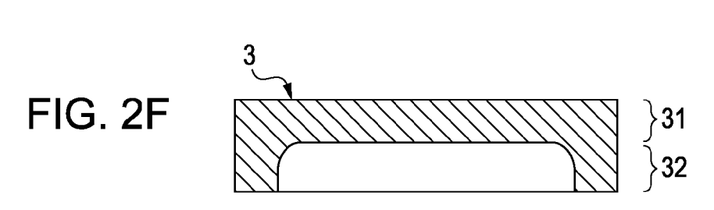

The cover members 3 of FIGS. 2A to 2C can be formed by separately forming the flat plate portion 31 and the frame portion 32 and then joining them together by adhesion or welding.

The cover members 3 of FIGS. 2D to 2F can be formed by mechanical processing, such as abrasion or blast, or chemical processing, such as etching, of a flat plate of glass or resin.

Figure 3A:
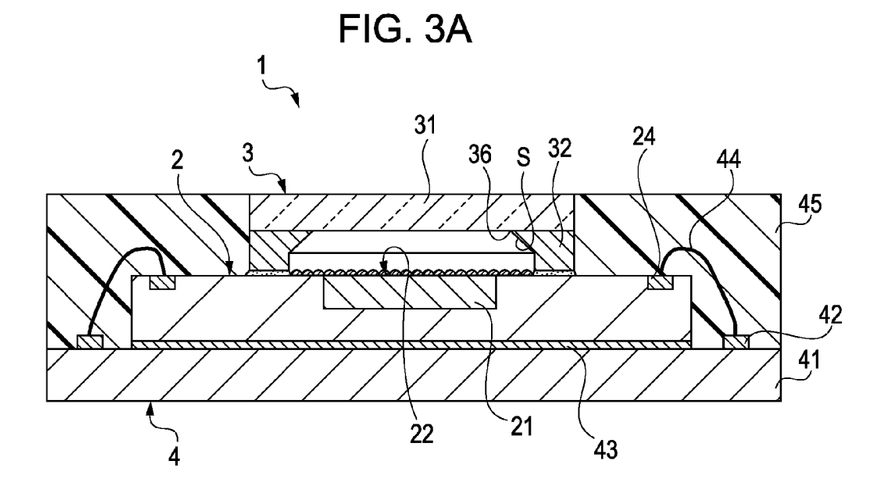
FIGS. 3A and 3B are a sectional view and a plan view showing an embodiment of a solid-state image pickup device according to the present invention.
Figure 3B:
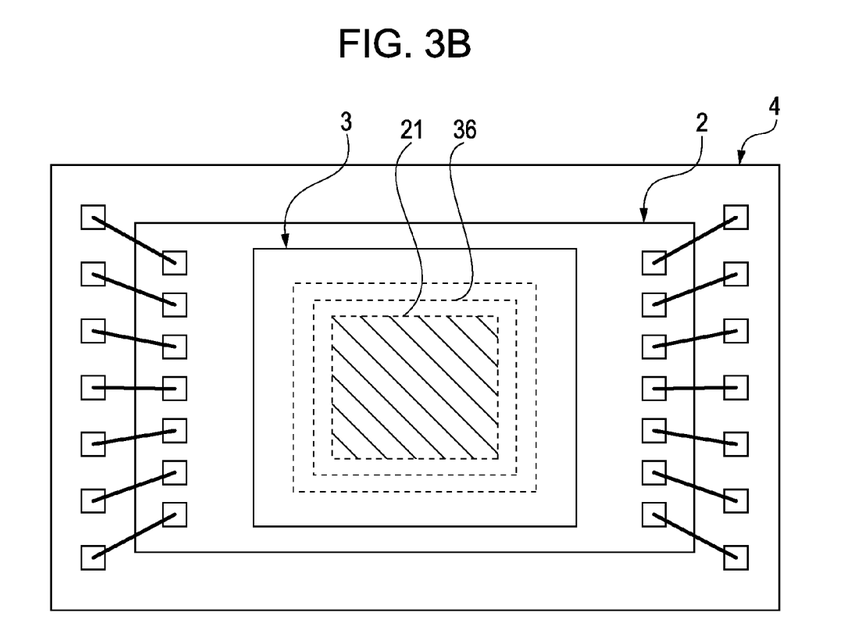

FIGS. 3A and 3B show the solid-state image pickup device 1 shown in FIG. 1A that is packaged. FIG. 3A is a sectional view of the solid-state image pickup device, and FIG. 3B is a plan view of the solid-state image pickup device of FIG. 3A. The solid-state image pickup element of the shown solid-state image pickup device is fixed to a wiring substrate 4, with a fixing member 43 on the opposite side of the solid-state image pickup element from the integral cover member and between the solid-state image pickup element and the wiring substrate 4. Terminals 24 of the solid-state image pickup element 2 and terminals 42 of the wiring substrate 4 are connected by conductive members 44 such as metal wires. In addition, in the solid-state image pickup device 1, a region surrounding the wiring substrate 4, the solid-state image pickup element 2, and the cover member 3 is sealed with a sealing member 45. As shown in FIG. 3B, outside the region just above the effective pixel region 21 is disposed an inclined surface edge 36 at which the non-vertical surface S of the cover member 3 meets the flat plate portion 31. That is to say, the non-vertical surface S of the cover member 3 is disposed outside the effective pixel region 21 of the solid-state image pickup element 2.

A lead frame, a printed wiring board, a flexible wiring board, and a metal base wiring board are used as the wiring substrate 4. In the case where the wiring substrate 4 is a lead frame, the solid-state image pickup element is fixed to the lead frame with a fixing member therebetween. The shown wiring substrate 4 is a printed wiring board and has a substrate 41 formed of ceramic or glass epoxy and terminals 42 disposed on the top of the substrate 41. The printed wiring board as a wiring substrate 4 has wiring on the top of or inside the substrate 41. The metal wires as conductive members 44 are used for signal transmission between the solid-state image pickup element 2 and the wiring substrate 4. The sealing member 45 is formed, for example, of epoxy resin. The sealing member 45 may be colored in black for light absorption. Owing to such a configuration, the solid-state image pickup device can further reduce the entrance of moisture into the space.

Second Embodiment

Next, a second embodiment will be described with reference to FIGS. 4A and 4B.

Figure 4A:
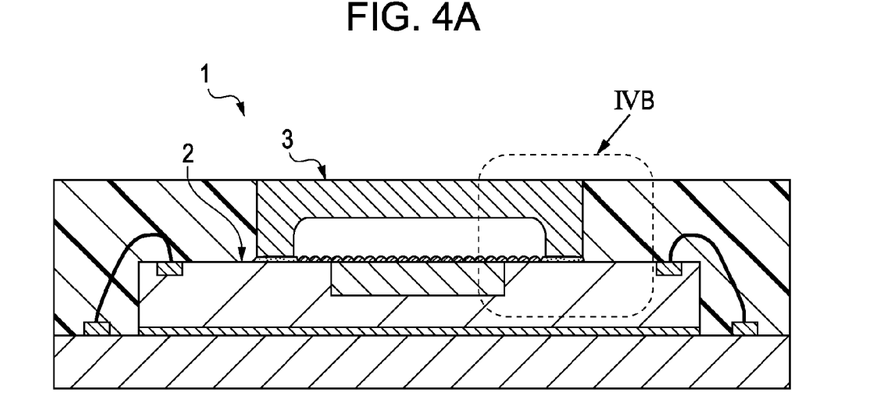
FIGS. 4A and 4B are a sectional view and an enlarged sectional view showing an embodiment of a solid-state image pickup device according to the present invention.
Figure 4B:
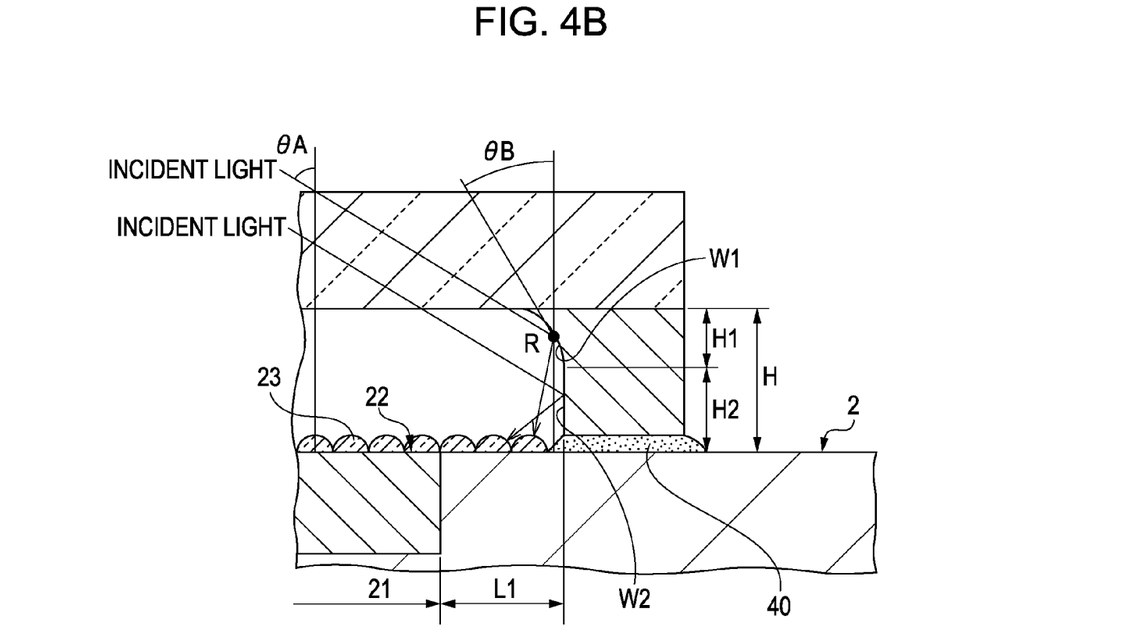

FIG. 4A is a sectional view of a solid-state image pickup device according to a second embodiment, and FIG. 4B is an enlarged sectional view of the part enclosed by a dashed line IVB of FIG. 4A.

The solid-state image pickup device 1 shown in FIGS. 4A and 4B differs from that of the first embodiment shown in FIGS. 1A to 1C in that the cover member shown in FIG. 2F is used as a cover member 3. That is to say, the flat plate portion 31 and the frame portion 32 are formed into an integral structure, and the non-vertical surface S of the frame portion 32 is a curved surface. As in the cover member 3 of the solid-state image pickup device of FIGS. 1A to 1C, the inner wall surface of the frame portion 32 includes a non-vertical surface S having a height of H1 such that the space 30 becomes gradually wider from the flat plate portion side toward the solid-state image pickup element side, and a vertical surface V having a height of H2, and has a total height of H.

As in the first embodiment, the inner wall structure satisfies the following relational expression:

$$H2 \tan \theta A \leq L1 \quad (1)$$

at any point on the vertical surface of the inner wall, and satisfies the following relational expression:

$$H \tan(\theta A - 2\theta B) + (H1) \tan \theta B \leq L1 \quad (2)$$

at any point on the non-vertical surface of the inner wall, where θA is the inclination angle of incident light with respect to a normal to the light detecting surface, θB is the inclination angle of the non-vertical surface S with respect to a normal to the light detecting surface at a point (R) on the non-vertical surface S on which the incident light is incident, H is the height of the frame portion 32, H1 is the height of the non-vertical surface, H2 is the height of the vertical surface, and L1 is the distance from the edge of the effective pixel region 21 to the vertical surface V of the inner wall of the frame portion.

By forming the inner wall within the ranges of the above relational expressions, both the reduction of image degradation (generation of so-called ghost images) caused by light reflected by the inner wall and incident on the pixel region, and the reduction in size of the solid-state image pickup element can be achieved.

Third Embodiment

Next, a third embodiment will be described with reference to FIGS. 5A and 5B. In this embodiment, the solid-state image pickup element has a light absorbing member outside the effective pixel region and inside the frame portion.

Figure 5A:
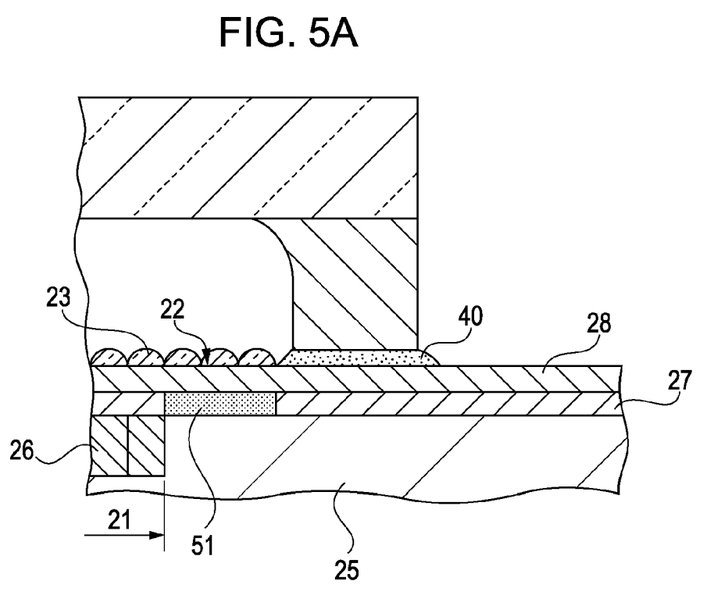
FIGS. 5A and 5B are sectional views showing an embodiment of a solid-state image pickup device according to the present invention.

FIG. 5A shows the solid-state image pickup device of FIG. 4B of the second embodiment in more detail. The solid-state image pickup element has a substrate 25 having a plurality of light detecting elements 26, color filters 27, and a planarizing film 28. The color filters 27 are disposed on the main surface of the substrate 25. Using photolithographic technique, a red (R), green (G), or blue (B) color filter is disposed at a position corresponding to each light detecting element. By adding, for example, emerald (E) color filters to the three colors of color filters, reproducibility of colors of an image can be improved. The planarizing film 28 disposed on the color filters is disposed in order to uniformly form microlenses 23. The microlenses 23 on the planarizing film 28 are formed in the following manner. First, a transparent film is formed using photolithographic technique. Next, a pattern is formed by etching. Thereafter, the pattern is heated and melted by a method such as reflow. By the action of surface tension, the pattern is shaped into lenses. The microlenses 23 have a role to collect incident light to the light detecting elements 26. Alternatively, a microlens array that is formed by nanoimprint, that is to say, by transferring lens shapes to a resin film using a die may be attached to the substrate 25. Nanoimprint technique can form the shape of the convexities relatively freely, and can therefore form convexities having a high aspect ratio.

The feature of this embodiment is that this embodiment has a light absorbing filter 51 as a light absorbing member that is disposed in the same layer as the color filters 27 and outside the effective pixel region 21. The light absorbing filter 51 is formed of black pigment or black dye, for example, by application, like the color filters 27.

Owing to such a configuration, light that is reflected by the inner wall of the cover member 3 and is incident on the outside of the effective pixel region 21 of the solid-state image pickup element 2 can be absorbed with the light absorbing filter 51.

Figure 5B:
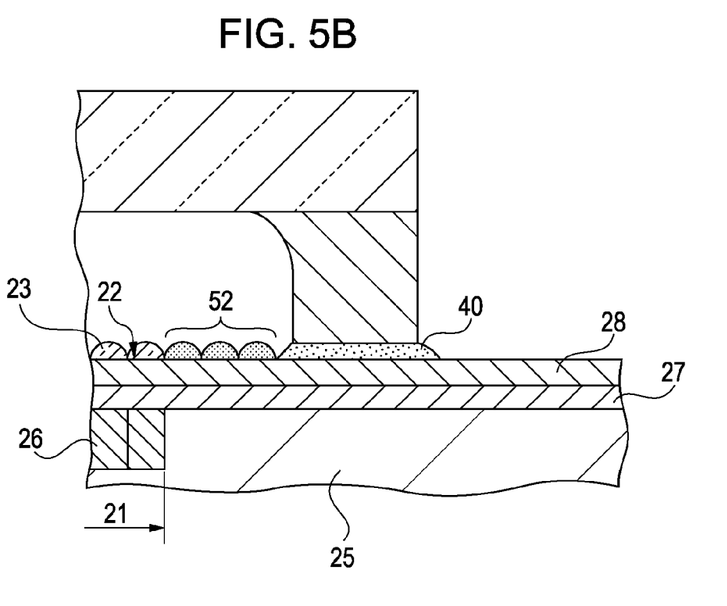

The solid-state image pickup device 1 of FIG. 5B differs from that of FIG. 5A in that the light absorbing member is not a light absorbing filter but light absorbing lenses 52 that are disposed in the same layer as the microlenses 23 and outside the effective pixel region 21. The light absorbing lenses 52 are formed by carbonizing microlenses that are formed outside the effective pixel region 21 with a laser.

Owing to such a configuration, light that is reflected by the inner wall of the cover member 3 and is incident on the outside of the effective pixel region 21 of the solid-state image pickup element 2 can be absorbed with the light absorbing lenses 52. Therefore, the solid-state image pickup device 1 of FIGS. 5A and 5B can reduce the incidence of light on a dark current measurement region disposed outside the effective pixel region 21 and the incidence of light on the effective pixel region 21 through the inside of the substrate 25, and can obtain excellent images.

Fourth Embodiment

Next, a fourth embodiment will be described with reference to FIG. 6. In this embodiment, the image pickup element further has convexities outside the frame portion.

Figure 6:
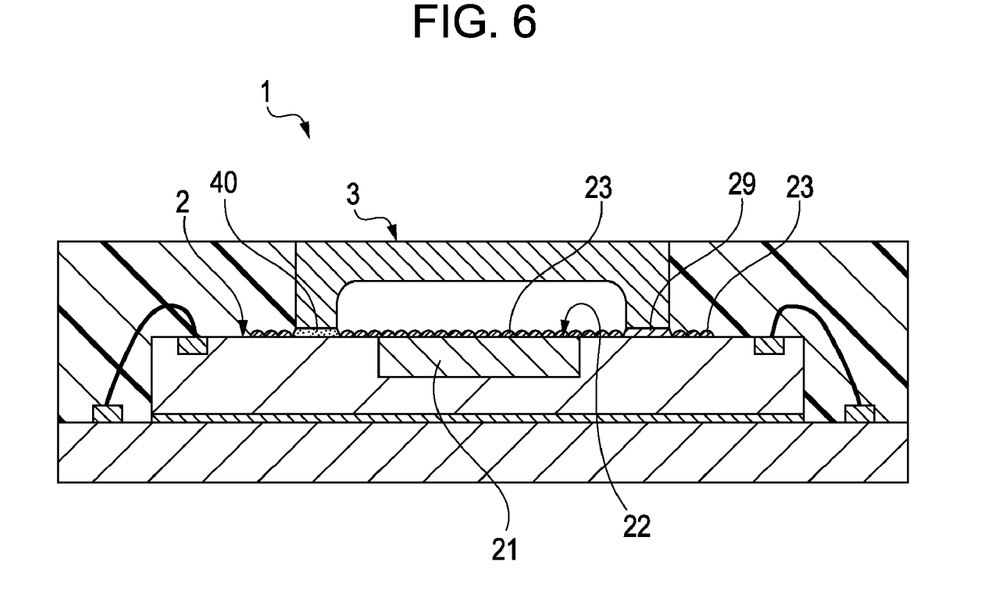
FIG. 6 is a sectional view showing an embodiment of a solid-state image pickup device according to the present invention.

FIG. 6 is a sectional view of a solid-state image pickup device according to a fourth embodiment.

The solid-state image pickup device 1 of FIG. 6 differs from the solid-state image pickup device of FIG. 4 in that the microlenses 23 are disposed also outside the cover member 3. In the fixing region, which is a region opposite the plane of the cover member 3 fixed to the solid-state image pickup element 2, the material forming the microlenses has a flat shape. That is to say, except for the flat portion 29 serving as the fixing region, microlenses are disposed inside (effective pixel region side) and outside of the frame portion of the cover member 3. Owing to such a configuration, adhesive that runs over when fixing the cover member 3 to the solid-state image pickup element 2 flows to the outside of the cover member 3 by capillary action due to the convexities of the microlenses outside the cover member 3. Therefore, adhesive that flows toward the effective pixel region can be reduced, and permeation of adhesive into the effective pixel region, which is one of the causes of image degradation, can be reduced. Therefore, the distance between the fixing region and the effective pixel region need not be increased in order to reduce permeation of adhesive into the effective pixel region. Therefore, the reduction in size of the solid-state image pickup device 1 can be achieved.

In the case where the region under the frame portion is flat, the frictional force is large compared to the case where the region under the frame portion is convex. The large frictional force can reduce misalignment of the frame portion. Therefore, the position of the frame portion in the planar direction is easier to stabilize.

Fifth Embodiment

Next, a fifth embodiment will be described with reference to FIGS. 7A to 7D.

Figure 7A:
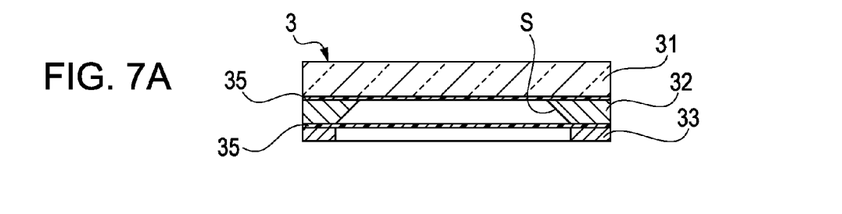
FIGS. 7A, 7B, 7C, and 7D are sectional views showing an embodiment of a cover member and a solid-state image pickup device according to the present invention.
Figure 7B:
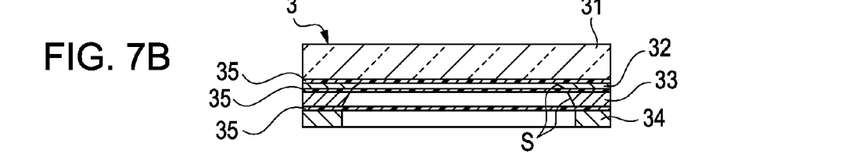
Figure 7C:
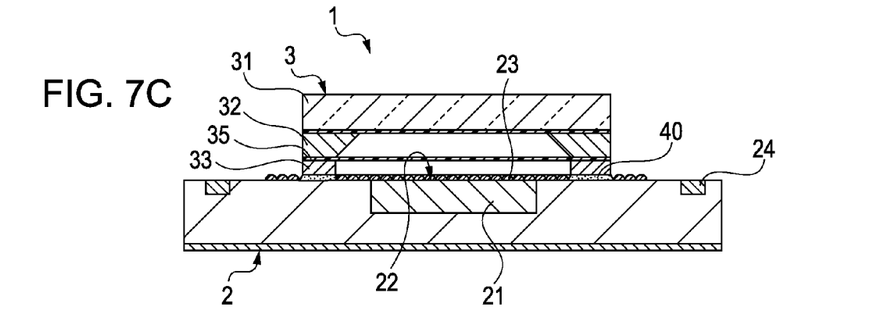
Figure 7D:
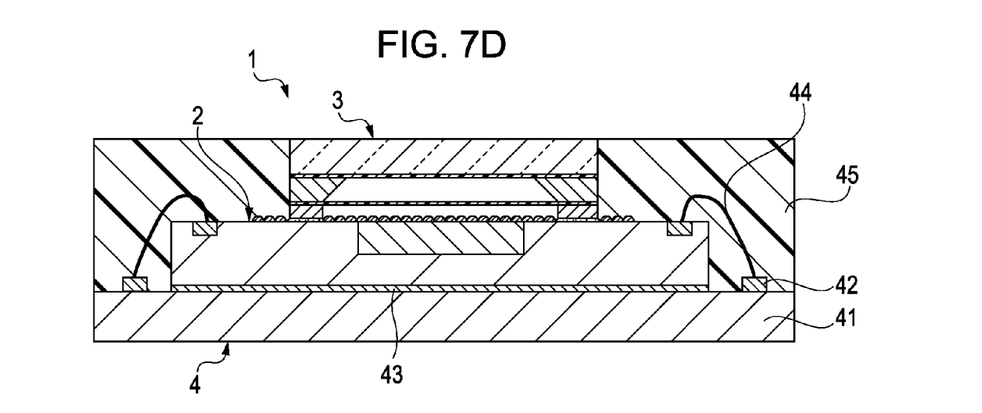

FIGS. 7A and 7B are sectional views of cover members according to a fifth embodiment. FIG. 7C is a sectional view of a solid-state image pickup device according to the fifth embodiment, and FIG. 7D shows the solid-state image pickup device of FIG. 7C that is packaged.

The cover members of FIGS. 7A and 7B differ from that shown in FIG. 2A in that the frame portion is composed of a plurality of components. In the cover member 3 of FIG. 7A, the flat plate portion 31 and components 32 and 33 of the frame portion are integrated, and the inner wall of the component 32 forms a non-vertical surface S. In the cover member 3 of FIG. 7B, the flat plate portion 31 and components 32, 33, and 34 are integrated, and the inner walls of the components 32 and 33 form a non-vertical surface S. The flat plate portion and the plurality of components are bonded together with a resin 35. The resin 35 is more flexible than the frame-shaped components 32 and 33.

In FIG. 7C, the cover member 3 of FIG. 7A is fixed to a solid-state image pickup element 2 with a fixing member 40.

Use of the cover members 3 shown in FIGS. 7A and 7B can reduce the probability of separation between the solid-state image pickup element 2 and the cover member 3 that have different thermal expansion coefficients. The reason is that the resin 35 absorbs the difference in coefficients of expansion or contraction due to temperature change between the solid-state image pickup element 2 and the cover member 3.

FIG. 7D shows the solid-state image pickup device of FIG. 7C that is packaged, which has the same configuration as that of FIG. 3A. In this embodiment, the sealing member 45 is formed of a resin that is flexible and has a high elastic coefficient, such as silicone, so that the sealing member 45 deform in response to the deformation of the solid-state image pickup element 2 and the cover member 3 due to temperature change. Therefore, resistance to peeling is improved.

Other Embodiments

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-138402 filed Jun. 9, 2009, which is hereby incorporated by reference herein in its entirety.

What is claimed is:

1. A device comprising:
   a pickup element having a pixel region having a plurality of light detecting elements; and
   a cover member that covers the pixel region and is fixed to the pickup element,
   wherein the cover member has a frame portion fixed to a region surrounding the pixel region, and a flat plate portion disposed over the pixel region with the frame portion and a space therebetween, and
   an inner wall of the frame portion has a non-vertical surface and an upright surface with respect to a light detecting surface of the image pickup element in an order from the flat plate portion, and satisfies the following expressions:

$$H2 \tan(\theta A - 2\theta C) \leq L1 + L1' \quad (1)$$

at any point on the upright surface, and $$H \tan(\theta A - 2\theta B) + (H1)\tan \theta B \leq L1 \quad (2) \text{ and}$$

$$\theta B > \theta C \quad (3)$$

at any point on the non-vertical surface, where θA is an inclination angle of incident light with respect to a normal to the light detecting surface, θB is an inclination angle of the non-vertical surface at a point on the non-vertical surface on which the incident light is incident, θC is an inclination angle of the upright surface at a point on the upright surface on which the incident light is incident, H is a height of the frame portion from the light detecting surface, H1 is a height of the non-vertical surface, H2 is a height of the upright surface from the light detecting surface, L1 is a distance from an edge of the pixel region to an upper edge of the upright surface of the inner wall of the frame portion in a direction parallel to the light detecting surface, and L1' is a distance from the upper edge to a lower edge of the upright surface in the direction parallel to the light detecting surface.

2. The device according to claim 1, wherein the non-vertical surface is a curved surface.

3. The device according to claim 1, wherein the non-vertical surface is disposed outside a region opposite the pixel region.

4. The device according to claim 1, wherein the pickup element has a light absorbing member outside the pixel region and inside the frame portion.

5. The device according to claim 4, further comprising convexities for collecting light to each of the plurality of light detecting elements in the pixel region, and wherein the light absorbing member is disposed in the same layer as the convexities.

6. The device according to claim 4, wherein the pickup element has color filters on the light incident side of the plurality of light detecting elements, and the light absorbing member is disposed in a same layer as the color filters.

7. The device according to claim 1, further comprising convexities for collecting light to each of the plurality of light detecting elements in the pixel region, and wherein the pickup element further has convexities disposed outside a region opposite the frame portion.

8. The device according to claim 1, wherein the frame portion has a plurality of components and a resin for bonding the plurality of components together, and the resin has an elastic coefficient lower than those of the plurality of components.

9. The device according to claim 8, wherein the plurality of components each have a frame shape.

10. The device according to claim 1, further comprising a wiring substrate fixed to an opposite side of the pickup element from the cover member, a conductive portion for transmitting signals between the pickup element and a wiring substrate, and a sealing member that seals a region surrounding the cover member and the conductive portion.

11. A device comprising:
a pickup element having a pixel region having a plurality of light detecting elements; and
a cover member that covers the pixel region and is fixed to the pickup element,
wherein the cover member has a frame portion fixed to a region surrounding the pixel region, and a flat plate portion disposed over the pixel region with the frame portion and a space therebetween, and
an inner wall of the frame portion has a non-vertical surface and a vertical surface with respect to a light detecting surface of the pickup element in an order from the flat plate portion, and satisfies the following expressions:

$$H2 \tan \theta A \leq L1 \quad (1)$$

at any point on the vertical surface, and $$H \tan(\theta A - 2\theta B) + (H1)\tan \theta B \leq L1 \quad (2)$$

at any point on the non-vertical surface, where θA is an inclination angle of incident light with respect to a normal to the light detecting surface, θB is an inclination angle of the non-vertical surface at a point on the non-vertical surface on which the incident light is incident, H is a height of the frame portion from the light detecting surface, H1 is a height of the non-vertical surface, H2 is a height of the vertical surface from the light detecting surface, and L1 is a distance from an edge of the pixel region to the vertical surface of the inner wall.

12. The device according to claim 11, wherein the non-vertical surface is a curved surface.

13. The device according to claim 11, wherein the non-vertical surface is disposed outside a region opposite the pixel region.

14. The device according to claim 11, wherein the pickup element has a light absorbing member outside the pixel region and inside the frame portion.

15. The device according to claim 11, further comprising convexities for collecting light to each of the plurality of light detecting elements in the pixel region, and wherein a light absorbing member is disposed in the same layer as the convexities.

16. The device according to claim 11, wherein the pickup element has color filters on the light incident side of the plurality of light detecting elements, and a light absorbing member is disposed in a same layer as the color filters.

17. The device according to claim 11, further comprising convexities for collecting light to each of the plurality of light detecting elements in the pixel region, and wherein the pickup element further has convexities disposed outside a region opposite the frame portion.

18. The device according to claim 11, wherein the frame portion has a plurality of components and a resin for bonding the plurality of components together, and the resin has an elastic coefficient lower than those of the plurality of components.

19. The device according to claim 18, wherein the plurality of components each have a frame shape.

20. The device according to claim 11, further comprising a wiring substrate fixed to an opposite side of the pickup element from the cover member, a conductive portion for transmitting signals between the pickup element and a wiring substrate, and a sealing member that seals a region surrounding the cover member and the conductive portion.

* * * * *